(12) United States Patent
Kim

(10) Patent No.: US 10,665,625 B2
(45) Date of Patent: May 26, 2020

(54) IMAGE SENSOR PACKAGE AND IMAGE SENSING MODULE

(71) Applicant: SAMSUNG ELECTRONICS CO., LTD., Suwon-si, Gyeonggi-Do (KR)

(72) Inventor: Young Bae Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 26 days.

(21) Appl. No.: 16/015,294

(22) Filed: Jun. 22, 2018

(65) Prior Publication Data

US 2019/0172862 A1 Jun. 6, 2019

(30) Foreign Application Priority Data

Dec. 4, 2017 (KR) .................... 10-2017-0165058

(51) Int. Cl.
| | | |
|---|---|---|
| H01L 27/146 | (2006.01) | |
| H04N 5/225 | (2006.01) | |
| H04N 5/369 | (2011.01) | |
| H01L 31/024 | (2014.01) | |

(52) U.S. Cl.
CPC .... *H01L 27/14618* (2013.01); *H01L 27/1469* (2013.01); *H01L 27/14627* (2013.01); *H01L 27/14634* (2013.01); *H01L 31/024* (2013.01); *H04N 5/2253* (2013.01); *H04N 5/2254* (2013.01); *H04N 5/369* (2013.01)

(58) Field of Classification Search
CPC ......... H01L 27/14618; H01L 27/14627; H01L 27/14634; H01L 31/024; H01L 27/1469; H04N 5/369; H04N 5/2254; H04N 5/2253

USPC ......................................................... 257/432
See application file for complete search history.

(56) References Cited

U.S. PATENT DOCUMENTS

| | | | |
|---|---|---|---|
| 6,815,234 B2 | 11/2004 | Wellhausen et al. | |
| 7,609,232 B2 | 10/2009 | Choi et al. | |
| 8,421,197 B2 | 4/2013 | Do et al. | |
| 2009/0262226 A1* | 10/2009 | Lee ........................ | H01L 25/043 348/294 |
| 2012/0286412 A1* | 11/2012 | Kimura ............... | H01L 23/3107 257/676 |
| 2014/0061841 A1* | 3/2014 | Kim ........................ | H01L 31/02 257/443 |

FOREIGN PATENT DOCUMENTS

| | | |
|---|---|---|
| JP | 2005045141 | 2/2005 |
| JP | 2016025404 | 2/2016 |
| KR | 10-2008-0054861 | 6/2008 |
| KR | 10-1711710 | 3/2017 |

* cited by examiner

*Primary Examiner* — Caleen O Sullivan
(74) *Attorney, Agent, or Firm* — F. Chau & Associates, LLC

(57) ABSTRACT

An image sensor package includes a substrate, an image sensor chip disposed on the substrate, and an external force absorbing layer disposed between the substrate and the image sensor chip and having a first surface and a second surface opposite to the first surface. The image sensor package further includes an adhesive layer configured to bond the second surface of the external force absorbing layer to the substrate. The adhesive layer has a first modulus, and the external force absorbing layer has a second modulus different from the first modulus.

20 Claims, 7 Drawing Sheets

IMAGE SENSOR PACKAGE AND IMAGE SENSING MODULE

CROSS-REFERENCE TO RELATED APPLICATION

This application claims priority under 35 U.S.C. § 119 to Korean Patent Application No. 10-2017-0165058 filed on Dec. 4, 2017 in the Korean Intellectual Property Office, the disclosure of which is incorporated by reference herein in its entirety.

TECHNICAL FIELD

The present disclosure relates to an image sensor and, more specifically, to an image sensor package and an image sensing module.

DISCUSSION OF THE RELATED ART

Image sensors convert an optical image into an electrical signal. As the computer industry and communications industry evolve, there is an increased demand for image sensors with improved performance in a variety of applications such as a digital camera, a camcorder, a personal communication system (PCS), a game device, a surveillance camera, and an endoscope.

Commonly used image sensor chips may include a charged coupled device (CCD) image sensor and a complementary metal-oxide; semiconductor (CMOS) image sensor. In particular, a CMOS image sensor is being widely used because it can reduce the manufacturing cost by using conventional semiconductor manufacturing technology and it can improve image quality by improving the signal processing algorithm.

SUMMARY

According to an exemplary embodiment of the present inventive concept, an image sensor package includes a substrate, an image sensor chip disposed on the substrate, and an external force absorbing layer disposed between the substrate and the image sensor chip and having a first surface and a second surface opposite to the first surface. The image sensor package further includes an adhesive layer configured to bond the second surface of the external force absorbing layer to the substrate. The adhesive layer has a first modulus, and the external force absorbing layer has a second modulus different from the first modulus.

According to an exemplary embodiment of the present inventive concept, an image sensor package includes a substrate, and an external force absorbing layer disposed on the substrate and having a first surface and a second surface opposite to the first surface. The first surface faces the substrate. The image sensor package further includes an adhesive layer interposed between the external force absorbing layer and the substrate to bond the first surface of the external force absorbing layer to the substrate, and a molding portion disposed on the second surface of the external force absorbing layer and including a memory chip and a thermal die. The image sensor package additionally includes an image sensor chip electrically connected to the memory chip and disposed on the molding portion. The adhesive layer has a first modulus, and the external force absorbing layer has a second modulus less than the first modulus.

According to an exemplary embodiment of the present inventive concept, an image sensing module includes a substrate having a first region, a second region surrounding the first region, and a third region surrounding the second region. The image sensing module further includes an adhesive layer having a first surface and a second surface opposed to each other. The first surface is bonded to the first region of the substrate. The image sensing module additionally includes an external force absorbing layer bonded to the second surface of the adhesive layer, a molding layer disposed on the external force absorbing layer, an image sensor chip disposed on the molding layer, a lens spaced apart from and disposed above the image sensor chip, and a support member disposed in the third region of the substrate and supporting the lens. The adhesive layer has a first modulus, and the external force absorbing layer has a second modulus less than the first modulus.

According to an exemplary embodiment of the present inventive concept, an image sensor package includes a substrate, and an adhesive layer disposed on the substrate and having a first modulus. The image sensor package further includes an external force absorbing layer disposed on the adhesive layer and having a second modulus. The external force absorbing layer extends beyond a side surface of the adhesive layer. The image sensor package additionally includes a molding layer disposed on the external force absorbing layer, and an image sensor chip disposed on the molding layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Exemplary embodiments of the present inventive concept will be described more fully hereinafter with reference to the accompanying drawings.

Figure 1:
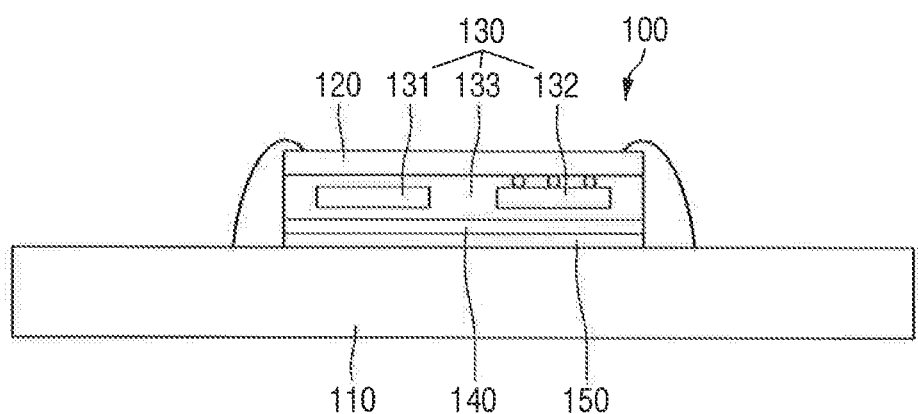
FIG. 1 is a schematic diagram illustrating an example of an image sensor package according to an exemplary embodiment of the present inventive concept.
Figure 2:
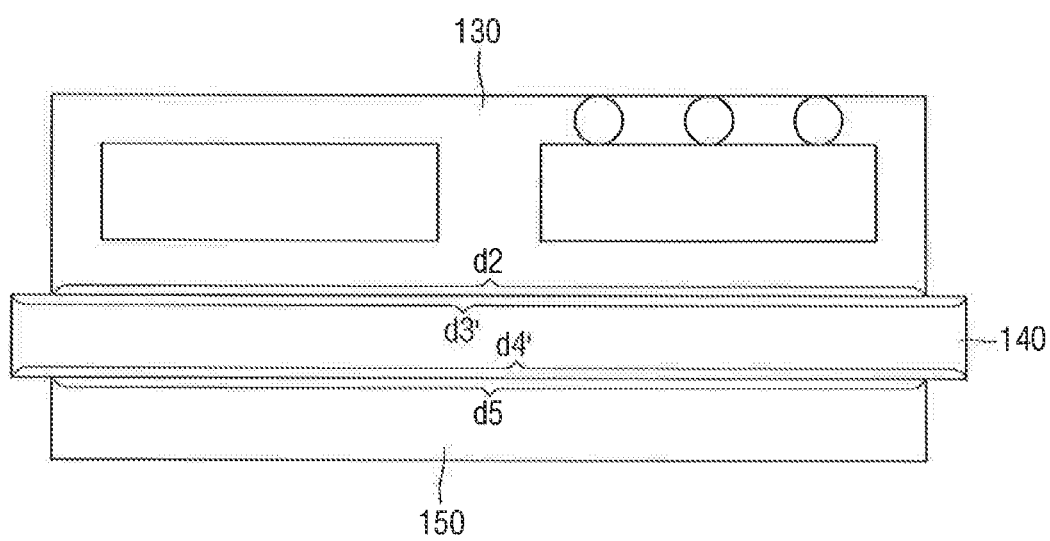
FIG. 2 is a schematic diagram illustrating an example of an image sensor package according to an exemplary embodiment of the present inventive concept.
Figure 3:
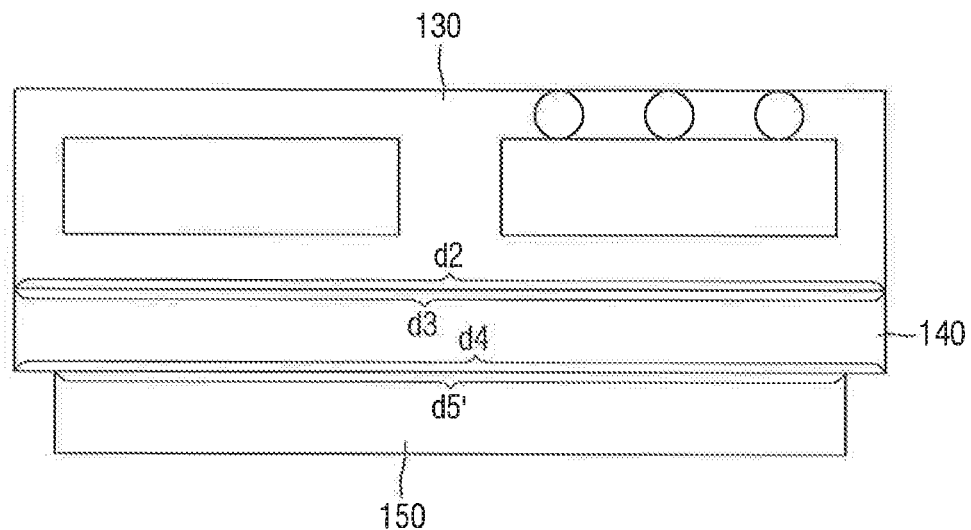
FIG. 3 is a schematic diagram illustrating an example of an image sensor package according to an exemplary embodiment of the present inventive concept.
Figure 4:
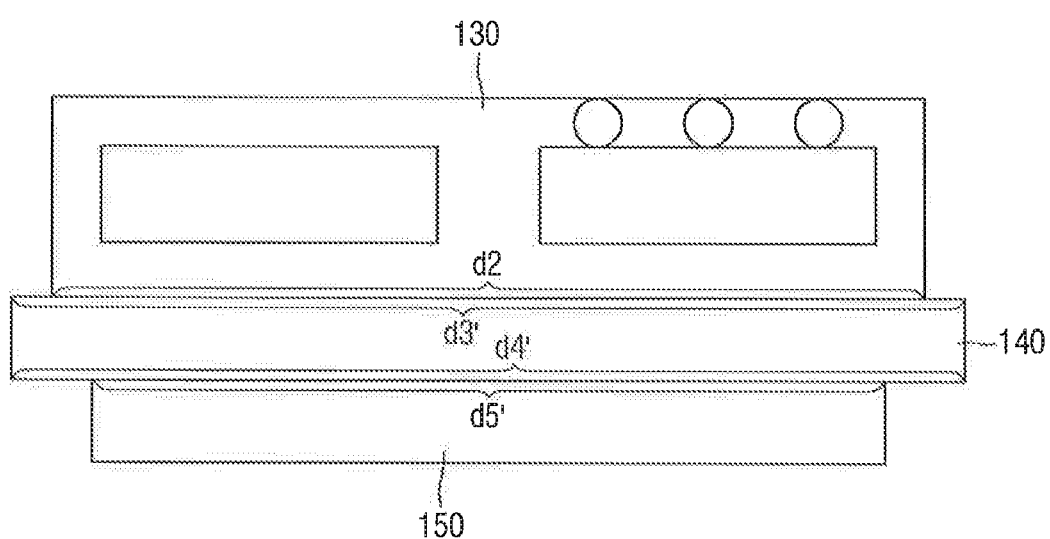
FIG. 4 is a schematic diagram illustrating an example of an image sensor package according to an exemplary embodiment of the present inventive concept.

FIG. 1 is a schematic diagram illustrating an example of an image sensor package according to an exemplary embodiment of the present inventive concept. FIG. 2 is a schematic diagram illustrating an example of an image sensor package according to an exemplary embodiment of the present inventive concept. FIG. 3 is a schematic diagram illustrating an example of an image sensor package according to an exemplary embodiment of the present inventive concept. FIG. 4 is a schematic diagram illustrating an example of an image sensor package according to an exemplary embodiment of the present inventive concept.

Referring to FIG. 1, an image sensor package 100 may include a substrate 110, an image sensor chip 120, a molding layer 130, an external force absorbing layer 140, and an adhesive layer 150. It is to be understood that the present inventive concept is not limited thereto. For example, additional elements or layers may be included or some of the listed elements or layers may be omitted.

The substrate 110 may include an electrical circuit therein, so that the circuit may be electrically connected to the image sensor chip 120 and an external element disposed on the substrate 110. For example, the substrate 110 may be an organic substrate, a silicon substrate, bulk silicon, or a silicon-on-insulator (SOI) having an electrical circuit therein.

The image sensor chip 120 may convert an optical signal received from an external source into an image signal. In an exemplary embodiment of the present inventive concept, the image sensor chip 120 may include an active pixel sensor (APS) that generates an optical signal in response to incident light and generates signal charges in response to the optical signal, a logic unit disposed adjacent to the APS to process an output signal transmitted from the APS, and a shield layer disposed above the logic unit to block electromagnetic waves.

The APS of the image sensor chip 120 may include a plurality of pixels. Each of the pixels may include a photoelectric conversion element, such as a photodiode, for sensing incident light to convert it into signal charges. The APS may further include a plurality of transistors for processing the signal charges by amplifying or switching them.

The logic unit of the image sensor chip 120 may include a driving circuit for driving each of the pixels of the APS, an analog-to-digital converter (ADC) for converting the signal charges into digital signals, and an image sensor processor (ISP) for forming an image signal by using the digital signals.

The shielding layer of the image sensor chip 120 may be disposed on the logic unit except for the APS to block the externally sourced electromagnetic waves from reading the image sensor chip 120.

According to an exemplary embodiment of the present inventive concept, the image sensor chip 120 may be a CMOS image sensor chip composed of a complementary metal-oxide semiconductor (CMOS) transistor including the APS, the logic unit and the shielding layer. It is, however, to be understood that this is merely illustrative. The image sensor chip 120 may be a CCD image sensor chip including a charge coupled device (CCD) having a larger data storage capacity and higher power consumption than a CMOS image sensor chip.

The molding layer 130 may be disposed between the substrate 110 and the image sensor chip 120.

The molding layer 130 may have first (e.g., upper) and second (e.g., lower) surfaces opposed to each other. The first surface of the molding layer 130 may be coupled with the image sensor chip 120. The second surface of the molding layer 130 may face the substrate 110.

The molding layer 130 may include a thermal die 131, a memory chip 132 and a molding portion 133. It is to be understood that the present inventive concept is not limited thereto. For example, additional elements or layers may be added to the molding layer 130 or some of the listed elements or layers may be omitted.

The memory chip 132 included in the molding layer 130 may be implemented as a volatile memory such as a dynamic RAM (DRAM). It is, however, to be understood that this is merely illustrative. The memory chip 132 may be implemented as a random access memory (RAM), a static RAM (SRAM), a static random access memory (SRAM), a synchronous DRAM (SDRAM), a thyristor RAM (T-RAM), a zero capacitor RAM (Z-RAM), or twin transistor RAM (TTRAM).

The memory chip 132 included in the molding layer 130 may be electrically connected to the image sensor chip 120.

The thermal die 131 included in the molding layer 130 may absorb heat generated in the memory chip 132 to prevent the memory chip 132 from being overheated. For example, the thermal die 131 may be made of a metal material having a high thermal conductivity or an alloy thereof.

The molding portion 133 may cover and/or surround the memory chip 132 and the thermal die 131. For example, the molding portion 133 may be used to fill the space between the memory chip 132 and the thermal die 131 and the space between the external force absorbing layer 140 and the image sensor chip 120. For example, the memory chip 132 and the thermal die 131 may be disposed in the molding portion 133.

The molding portion 133 may include an epoxy resin material.

The external force absorbing layer 140 may absorb external force applied to the back surface of the image sensor chip 120.

The external force absorbing layer 140 may include a polyimide layer.

The external force absorbing layer 140 may be disposed between the molding layer 130 and the adhesive layer 150.

The external force absorbing layer 140 may have a third (e.g., an upper) surface and a fourth (e.g., a lower) surface opposed to each other. The third surface of the external force absorbing layer 140 may be coupled with the second surface of the molding layer 130 facing the substrate 110. The fourth surface of the external force absorbing layer 140 may be in contact with the adhesive layer 150. The area of the third surface of the external force absorbing layer 140 may be substantially equal to the area of the second surface of the molding layer 130. For example, side surfaces of the molding layer 130, the external force absorbing layer 140 and the adhesive layer 150 may be coplanar. As an additional example, the area of the third surface and the area of the fourth surface of the external force absorbing layer 140 may each be substantially equal to an area of a fifth surface of the adhesive layer 150 in contact with the fourth surface, it is, however, to be understood that this is merely illustrative. The area of the third surface of the external force absorbing layer 140 may be different from the area of the second surface of the molding layer 130.

For example, referring to FIG. 2, the external force absorbing layer 140 may have a third surface d3' and a fourth surface d4' that are opposite to each other. The area of the third surface d3' of the external force absorbing layer 140 may be larger than the area of the second surface d2 of the molding layer 130 disposed on the third surface d3' of the external force absorbing layer 140. For example, the third surface d3' of the external force absorbing layer 140 may be in contact with the second surface d2 of the molding layer 130. As an additional example, the area of the fourth surface d4' of the external force absorbing layer 140 may be larger than the area of the second surface d2 of the molding layer 130. The area of the fourth surface d4' of the external force absorbing layer 140 may be larger than the area of the fifth surface d5 of the adhesive layer 150 disposed on the fourth surface d4' of the external force absorbing layer 140. For example, the third surface d3' of the external force absorbing layer 140 may be larger than the fifth surface d5 of the adhesive layer 150. In addition, the area of the second surface d2 of the molding layer 130 may be substantially equal to the area of the fifth surface d5 of the adhesive layer 150. For example, the external force absorbing layer 140 may extend beyond the side surfaces of the molding layer 130 and the adhesive layer 150.

The external force absorbing layer 140 may be larger than the image sensor chip and the molding layer 130 as shown in FIG. 2 and may further mitigate the impact applied to the image sensor chip and the molding layer 130.

Referring again to FIG. 1, the adhesive layer 150 may bond the substrate 110 with the fourth surface of the external force absorbing layer 140. The area of the fourth surface of the external force absorbing layer 140 may be substantially equal to the area of the fifth surface of the adhesive layer 150 in contact with the external force absorbing layer 140. It is, however, to be understood that this is merely illustrative. The area of the fourth surface of the external force absorbing layer 140 may be different from the area of the fifth surface of the adhesive layer 150 in contact with the external force absorbing layer 140.

For example, referring to FIG. 3, the external force absorbing layer 140 may have a third surface d3 and a fourth surface d4 that are opposite to each other. The area of the third surface d3 of the external force absorbing layer 140 may be substantially equal to the area of the second surface d2 of the molding layer 130 disposed on the third surface d3 of the external force absorbing layer 140. For example, the second surface d2 of the molding layer 130 may be in contact with the third surface d3 of the external force absorbing layer 140. As an additional example, the area of the second surface d2 of the molding layer 130 may be substantially equal to the area of the fourth surface d4 of the external force absorbing layer 140. The area of the fourth surface d4 of the external force absorbing layer 140 may be larger than the area of the fifth surface d5' of the adhesive layer 150 disposed on the fourth surface d4 of the external force absorbing layer 140. In addition, the area of the second surface d2 of the molding layer 130 may be greater than the area of the fifth surface d5' of the adhesive layer 150. For example, the molding layer 130 and the external force absorbing layer 140 may extend beyond an edge of the adhesive layer 150, and a side surface of the molding layer 130 and a side surface of the external force absorbing layer 140 may be coplanar.

For example, referring to FIG. 4, the external force absorbing layer 140 may have a third surface d3' and a fourth surface d4' opposed to each other. The area of the third surface d3' of the external force absorbing layer 140 may be larger than the area of the second surface d2 of the molding layer 130 disposed on the third surface d3' of the external force absorbing layer 140. The area of the fourth surface d4' of the external force absorbing layer 140 may be larger than the area of the fifth surface d5' of the adhesive layer 150 disposed on the fourth surface d4' of the external force absorbing layer 140. In addition, the area of the second surface d2 of the molding layer 130 may be greater than the area of the fifth surface d5' of the adhesive layer 150. For example, the external force absorbing layer 140 may extend beyond the side surfaces of the molding layer 130 and the adhesive layer 150, and the molding layer 130 may extend beyond a side surface of the adhesive layer 150.

Referring again to FIG. 1, the adhesive layer 150 may include an epoxy resin, an acrylic resin, a silicone resin, or a mixture thereof. It is, however, to be understood that this is merely illustrative. A variety of types of adhesives may be used as the adhesive layer 150.

According to an exemplary embodiment of the present inventive concept, the external force absorbing layer 140 may have a modulus (e.g., a modulus of elasticity) different from the modulus of the adhesive layer 150. For example, a second modulus of the external force absorbing layer 140 may be less than a first modulus of the adhesive layer 150.

The modulus may refer to a number representing a ratio of a stress to the resulting strain. For example, the modulus may represent an object or substance's resistance to being deformed elastically when a stress is applied to it.

When the second modulus of the external force absorbing layer 140 is smaller than the first modulus of the adhesive layer 150, the stress applied to the image sensor chip may be reduced. This will be described in more detail with reference to FIG. 5.

Figure 5:
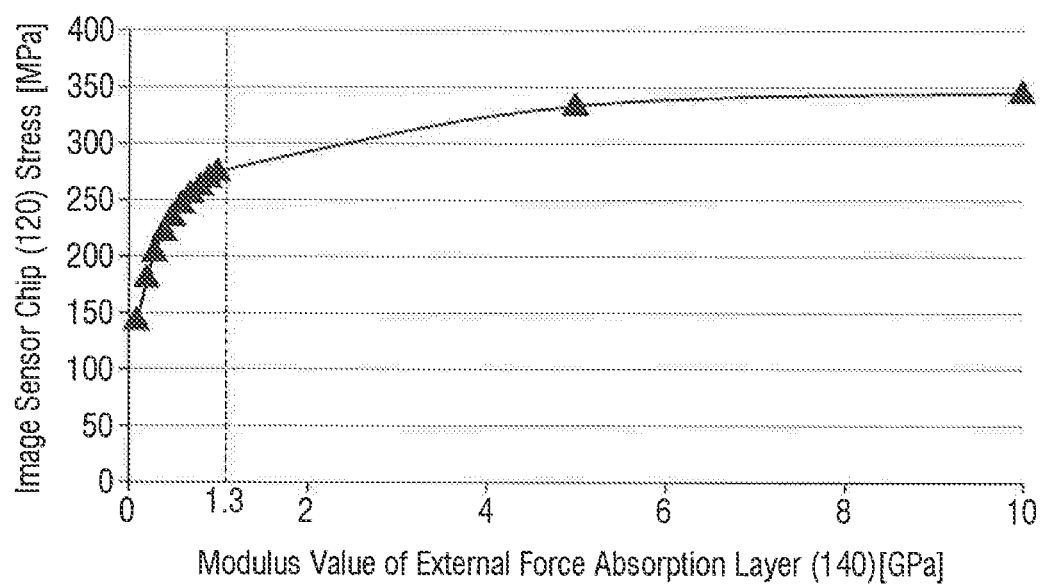
FIG. 5 is a graph showing the influence of a change in the modulus of the external force absorbing layer on the stress applied to the image sensor chip according to exemplary embodiments of the present inventive concept.

FIG. 5 is a graph showing the influence of a change in the modulus of the external force absorbing layer on the stress applied to the image sensor chip according to exemplary embodiments of the present inventive concept.

In the experiment of FIG. 5, the adhesive layer 150 having the modulus of 1.3 GPa was used. In the experimental example of FIG. 5, the external force of 100 N was applied to the image sensor package 100 (see, e.g., FIG. 1).

The graph of FIG. 5 shows stress applied to the image sensor chip 120 when the modulus of the external force absorbing layer 140 is changed.

In the graph of FIG. 5, the x-axis represents the modulus value of the external force absorbing layer 140, and the y-axis represents stress applied to the image sensor chip 120.

As can be seen in the graph of FIG. 5, by additionally disposing the external force absorbing layer 140, the stress applied to the image sensor chip 120 is reduced regardless of the modulus of the external force absorbing layer. This is because the external force absorbing layer 140 can absorb at least a portion of the external force.

When the modulus of the external force absorbing layer 140 ranges from 1.3 GPa to 10 GPa, which is the modulus of the adhesive layer 150, it can be seen that the stress applied to the image sensor chip 120 is slightly reduced.

When the modulus of the external force absorbing layer 140 is less than 1.3 GPa, which is the modulus of the adhesive layer 150, it can be seen that the stress applied to the image sensor chip is drastically reduced compared to when the modulus of the external force absorbing layer 140 ranges from 1.3 GPa to 10 GPa.

Table 1 shows in more detail the change in the stress applied to the image sensor chip 120 when the modulus of the external force absorbing layer 140 is changed.

TABLE 1

| Modulus of External Force Absorbing Layer [GPa] | Stress Applied to Image Sensor Chip [MPa] |
|---|---|
| 0.1 | 144.3 |
| 0.2 | 181.2 |
| 0.3 | 205.2 |
| 0.4 | 222.8 |
| 0.5 | 236.2 |
| 0.6 | 243.6 |
| 0.7 | 255.5 |
| 0.8 | 263.1 |
| 0.9 | 269.6 |
| 1 | 275.2 |
| 1.3 | 323.1 |
| 5 | 333.7 |
| 10 | 344.7 |

If the image sensor package 100 includes the adhesive layer 150 having the modulus of 1.3 GPa and does not include the external force absorbing layer 140, when the external force of 100 N is applied to the image sensor package 100 (see, e.g., FIG. 1), the stress applied to the image sensor chip 120 may be substantially equal to 348 MPa In contrast, when the external force absorbing layer 140 is included in the image sensor package 100, it can be seen from Table 1 that the stress applied to the image sensor chip 120 is partially reduced.

For example, when the external force absorbing layer 140 is disposed between the molding layer 130 and the adhesive layer 150, it can be seen that the stress applied to the image sensor chip 120 becomes smaller than 348 MPa.

In addition, it can be seen from Table 1 that the stress applied to the image sensor chip 120 is drastically reduced when the modulus of the external force absorbing layer 140 is less than 1.3 GPa, which is the modulus of the adhesive layer 150.

For example, when the modulus of the external force absorbing layer 140 becomes one-thirteenth of the modulus of the adhesive layer 150 (e.g., the modulus of the external force absorbing layer 140 becomes 0.1 GPa), it can be seen that the stress applied to the image sensor chip 120 may be reduced by approximately 60% as compared with the stress applied to the image sensor chip 120 without the external force absorbing layer 140 included in the image sensor package 100.

Thus, by disposing the external force absorbing layer 140 having a modulus less than the modulus of the adhesive layer 150 between the molding layer 130 and the adhesive layer 150, the stress applied to the image sensor chip 120 may be reduced.

Figure 6:
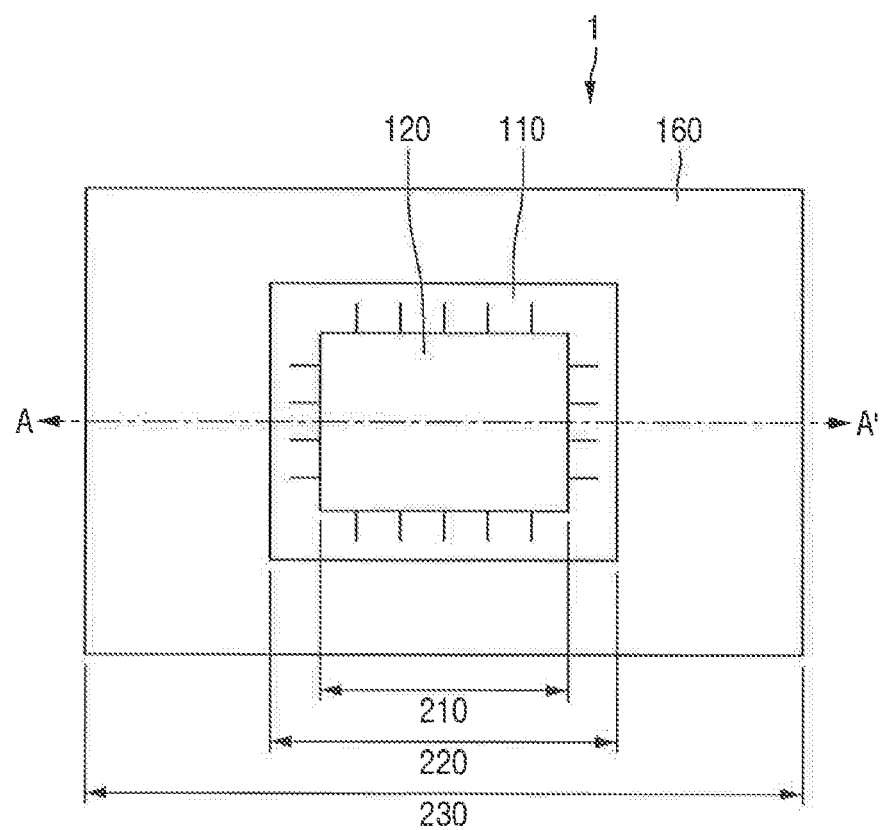
FIG. 6 is a plan view illustrating an image sensing module according to an exemplary embodiment of the present inventive concept.
Figure 7:
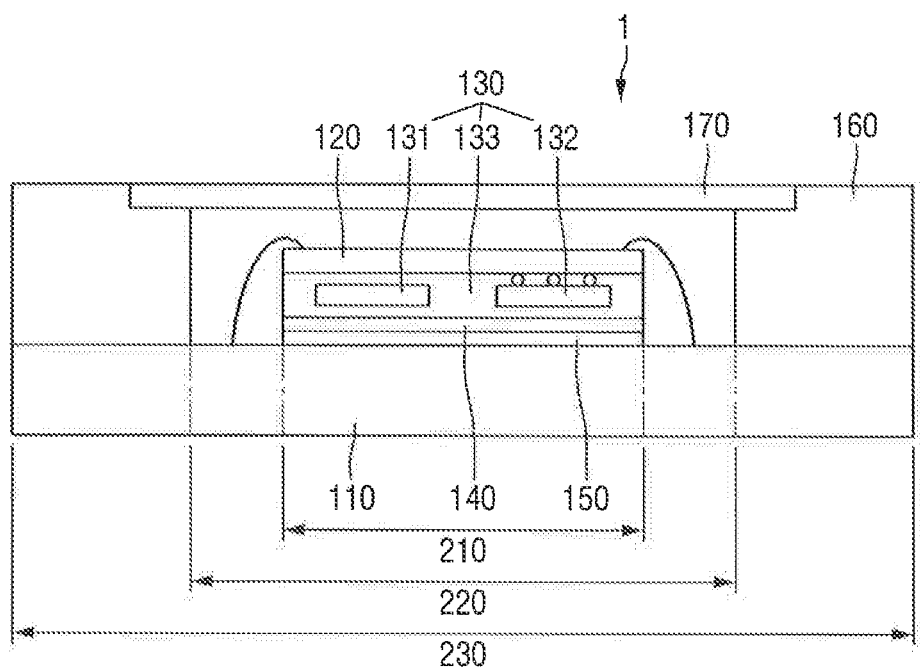
FIG. 7 is a cross-sectional view taken along line A-A' of FIG. 6 according to an exemplary embodiment of the present inventive concept.

FIG. 6 is a plan view illustrating an image sensing module according to an exemplary embodiment of the present inventive concept. FIG. 7 is a cross-sectional view taken along line A-A' of FIG. 6 according to an exemplary embodiment of the present inventive concept. The descriptions may focus on differences from above exemplary embodiments of the present inventive concept described with reference to FIGS. 1 to 5, and to the extent that the description of various elements omitted, it may be assumed that these elements are at least similar to corresponding elements that have already been described.

Referring to FIGS. 6 and 7, the image sensing module 1 may include a substrate 110, an image sensor chip 120, a molding layer 130, an external force absorbing layer 140, an adhesive layer 150, a support member 160 and a lens 170. It is to be understood that the present inventive concept is not limited thereto. For example, elements may be included in the image sensing module 1 or some of the listed elements may be omitted.

The substrate 110 may include a first region 210, a second region 220 surrounding the first region 210, and a third region 230 surrounding the second region 220. For example, the third region 230 may surround the first and second regions 210 and 220. The first region 210 and the third region 230 may be spaced apart from each other, and the second region 220 may be disposed between the first region 210 and the third region 230.

The image sensor chip 120 may be disposed on the substrate 110 in the first region 210. The support member 160 may be disposed on the substrate 110 in the third region 230.

The adhesive layer 150 may include a first surface and a second surface opposed to each other, and the first surface may be bonded to the substrate 110 in the first region 210.

The external force absorbing layer 140 may be disposed on the adhesive layer 150 and bonded to the second surface of the adhesive layer 150.

The external force absorbing layer 140 may absorb external force or an external impact applied to a surface (e.g., the back surface) of the image sensor chip 120 that is facing the external force absorbing layer 140.

The first modulus of the adhesive layer 150 may be different from the second modulus of the external force absorbing layer 140.

For example, a second modulus of the external force absorbing layer 140 may be less than a first modulus of the adhesive layer 150.

The external force absorbing layer 140 may have a third surface and a fourth surface opposite to each other.

The area of the first region 210 of the substrate 110 may be substantially equal to each of the areas of the third and fourth surfaces of the external force absorbing layer 140.

The second surface of the adhesive layer 150 may be bonded to the third surface of the external force absorbing layer 140.

The molding layer 130 may include a thermal die 131, a memory chip 132 and a molding portion 133.

The memory chip 132 included in the molding layer 130 may be electrically connected to the image sensor chip 120. For example, the memory chip 132 may be electrically connected to the image sensor chip 120 through solder balls disposed between the image sensor 120 and the memory chip 132.

The thermal die 131 included in the molding layer 130 may absorb heat generated in the memory chip 132 to prevent the memory chip 132 from being overheated.

The molding portion 133 may cover the thermal die 131 and the memory chip 132. For example, the molding portion 133 may be used to fill the space between the memory chip 132 and the thermal die 131 and the space between the external force absorbing layer 140 and the image sensor chip 120.

The image sensor chip 120 may be disposed on the molding layer 130.

According to an exemplary embodiment of the present inventive concept, the image sensor chip 120 may be a CMOS image sensor chip including a complementary metal-oxide semiconductor (CMOS) transistor including the APS, the logic unit and the shielding layer. It is, however, to be understood that this is merely illustrative. The image sensor chip 120 may be a CCD image sensor chip including a charge coupled device (CCD) having a larger data storage capacity and higher power consumption than a CMOS image sensor chip.

The lens 170 may be spaced apart from and disposed above the image sensor chip 120.

The lens 170 may be made of a transparent material such as glass and may converge or diverge light reflected from a subject to form an optical image. For example, the lens 170 may guide an optical signal traveling radially from a subject toward the image sensor chip 120.

For example, the lens 170 may include at least one lens 170 disposed in a hole formed at the upper portion of the support member 160 that condenses external light and guides the light onto the image sensor chip 120. More than one lens 170 may be disposed on the support member 160 of the image sensing module 1.

For example, an infrared cutoff filter may be further disposed between the lens 170 and the image sensor chip 120.

The infrared cutoff filter may filter the infrared light from the light that has passed through the lens 170.

The infrared cutoff filter may be disposed between the lens 170 and the image sensor chip 120 to block the infrared region of the incident light from the outside, thereby improving the color reproduction of the image sensing module 1.

The support member 160 may be disposed on the substrate 110 in the third region 230 and may support the lens 170. The support member 160 may include various lens holders for holding the lens 170.

The support member 160 may support the lens 170 and may house the image sensor chip package. For example, the support member 160 may be disposed to surround the image sensor chip package.

The support member 160 may be disposed in the third region 230 and thus may be spaced apart from the image sensor chip 120, the molding layer 130, the external force absorbing layer 140 and the adhesive layer 150.

The support member 160 may be formed by injection molding using an epoxy resin, an alkyd resin, a silicone resin, or the like.

Figure 8:
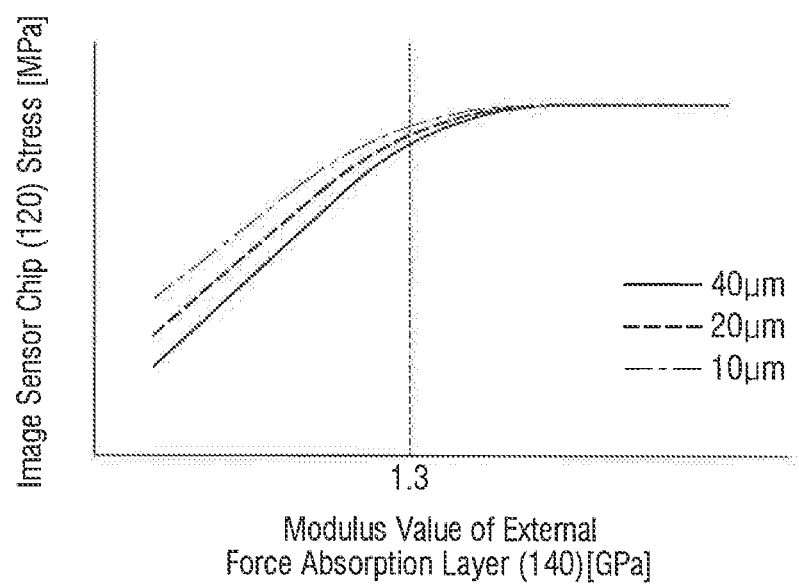
FIG. 8 is a graph showing the influence of a change in the thickness of the external force absorbing layer on the stress applied to the image sensor chip according to exemplary embodiments of the present inventive concept.

FIG. 8 is a graph showing the influence of a change in the thickness of the external force absorbing layer on the stress applied to the image sensor chip according to exemplary embodiments of the present inventive concept.

In the experimental example of FIG. 8, the adhesive layer 150 having the modulus of 1.3 GPa was included in the image sensor chip package, and the external force of 100 N was applied to the image sensing module 1 (see, e.g., FIGS. 6 and 7).

In the graph of FIG. 8, the x-axis represents the modulus of the external force absorbing layer 140, and the y-axis represents stress applied to the image sensor chip 120.

Referring to FIG. 8, the solid line represents experimental results when the external force absorbing layer 140 having the thickness of 40 μm is used. The dashed line represents experimental results when the external force absorbing layer 140 having the thickness of 20 μm is used. The dot-dashed line represents experimental results when the external force absorbing layer 140 having the thickness of 10 μm is used.

The graph of FIG. 8 shows the stress applied to the image sensor chip 120 when the modulus and the thickness of the external force absorbing layer 140 are at different magnitudes.

It can be seen from the graph shown in FIG. 8 that the stress applied to the image sensor chip 120 does not substantially vary when the thickness of the external force absorbing layer 140 is between 10 and 40 μm and the modulus of the external force absorbing layer 140 is larger than 1.3 GPa, which is the modulus of the adhesive layer 150.

In contrast, it can be seen that the stress applied to the image sensor chip 120 is reduced as the thickness of the external force absorbing layer 140 becomes larger and the modulus of the external force absorbing layer 140 is less than 1.3 GPa, which is the modulus of the adhesive layer 150.

For example, it can be seen that the stress applied to the image sensor chip 120 may be reduced as the external force absorbing layer 140 becomes thicker and the modulus becomes smaller.

However, since the size of the image sensor package is limited, the thickness of the external force absorbing layer 140 cannot be increased beyond a certain limit. Thus, the external force absorbing layer 140 may have the maximum size within the size of the image sensor package.

Figure 9:
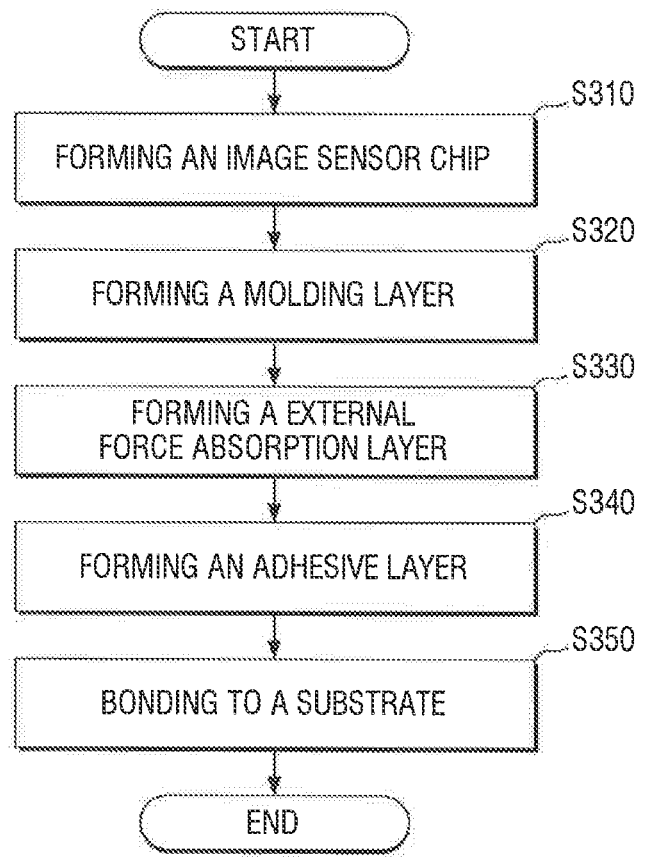
FIG. 9 is a flowchart illustrating an example of a method of fabricating an image sensor package according to an exemplary embodiment of the present inventive concept.
Figure 10:
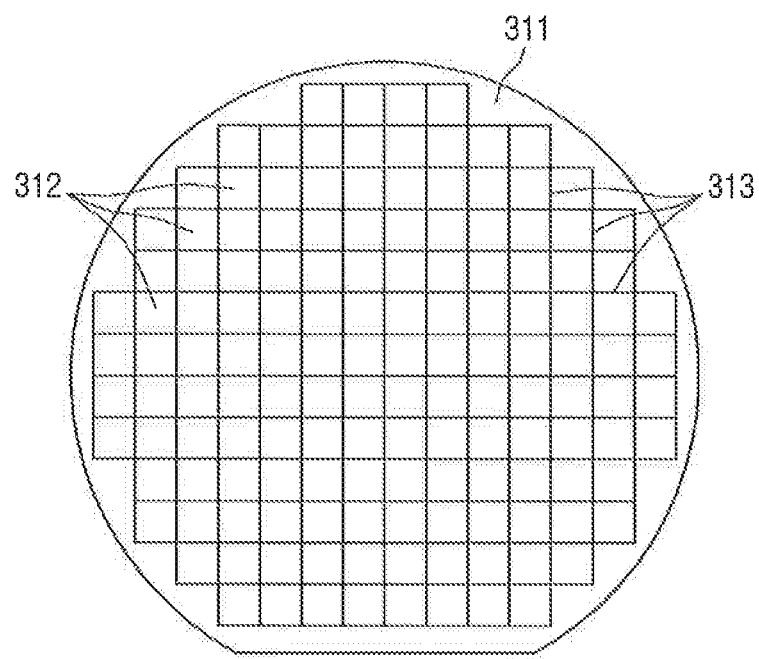
FIG. 10 is a schematic diagram illustrating a process of producing an image sensor chip mounted on an image sensor package according to an exemplary embodiment of the present inventive concept.

FIG. 9 is a flowchart illustrating an example of a method of fabricating an image sensor package according to an exemplary embodiment of the present inventive concept. FIG. 10 is a schematic diagram illustrating a process of producing an image sensor chip mounted on an image sensor package. For brevity, descriptions may focus on differences from above exemplary embodiments of the present inventive concept described with reference to FIGS. 1 to 8, and to the extent that the description of various elements omitted, it may be assumed that these elements are at least similar to corresponding elements that have already been described.

Referring to FIG. 9, image sensor chips may be formed to fabricate an image sensor package (step S310).

Referring to FIG. 10, image sensor chips 312 may be formed on a silicon substrate 311 made of a silicon material. The adjacent image sensor chips 312 may be separated one from another by scribe lines 313.

The image sensor chips 312 formed on the silicon substrate 311 of the silicon material may be cut along the scribe lines 313. Each of the cut image sensor chips may be included in one image sensor package. It is, however, to be understood that this is merely illustrative. More than one image sensor chip 312 may be included in one image sensor package.

According to an exemplary embodiment of the present inventive concept, the image sensor chip 312 may be a CMOS image sensor chip including a complementary metal-oxide semiconductor (CMOS) transistor including the APS, the logic unit and the shielding layer. It is, however, to be understood that this is merely illustrative. The image sensor chip 312 may be a CCD image sensor chip including a charge coupled device (CCD) having a larger data storage capacity and higher power consumption than a CMOS image sensor chip.

Referring back to FIG. 9, in step S320, a molding layer including a memory chip and a thermal die may be produced. The molding layer may include a thermal die, a memory chip and a molding portion.

The memory chip included in the molding layer may be formed via a separate process. The memory chip included in the molding layer may be implemented as a volatile memory such as a dynamic RAM (DRAM). It is, however, to be understood that this is merely illustrative. The memory chip may be implemented as a random access memory (RAM), a static RAM (SRAM), a static random access memory (SRAM), a synchronous DRAM (SDRAM), a thyristor RAM (T-RAM), a zero capacitor RAM (Z-RAM), or twin transistor RAM (TTRAM).

Once the memory chip to be included in the molding layer is formed, the memory chip and the thermal die may be covered with the molding portion. The molding portion may include an epoxy resin-based material.

The image sensor chip and the molding layer formed through steps S310 and S320 may be coupled with each other. For example, the image sensor chip may include a first surface (e.g., a top or upper surface) and a second surface (e.g., a back or lower surface) opposed to each other. The first surface may be disposed to face a lens of the image sensing module, and the second surface may be coupled with the molding layer.

When the image sensor chip and the molding layer are coupled together, the image sensor chip and the memory chip included in the molding layer may be electrically connected with each other.

In step S330, an external force absorbing layer may be formed. The external force absorbing layer may absorb an external force applied to the back surface of the image sensor chip, and may include a polyimide layer.

In step S340, an adhesive layer may be formed. The adhesive layer may include an epoxy resin, an acrylic resin, a silicone resin, or a mixture thereof. It is, however, to be understood that this is merely illustrative. A variety of types of adhesives may be used as the adhesive layer.

The adhesive layer may be formed in a variety of ways.

For example, the adhesive layer may be produced as a film. The film-type adhesive layer may be cut into a desired size. The film-type adhesive layer may be bonded to a surface of the external force absorbing layer.

As an example, the material of the adhesive layer may be pasted on a side of the external force absorbing layer. The material pasted on the surface of the external force absorbing layer may form a layer through screening, and the layer thus formed may become the adhesive layer.

The method for forming the adhesive layer is not limited to that described above, and the adhesive layer may be formed through a variety of methods.

According to an exemplary embodiment of the present inventive concept, the modulus of the external force absorbing layer may have a value different from the modulus of the adhesive layer.

For example, a second modulus of the external force absorbing layer may be less than a first modulus of the adhesive layer. When the second modulus of the external force absorbing layer 140 is smaller than the first modulus of the adhesive layer, the stress applied to the image sensor chip may be reduced.

The order that steps S310 to S340 are carried out is not limited to that described above and the order of the steps S310 to S340 may vary.

In step S350, the image sensor chip, the molding layer, the external force absorbing layer and the adhesive layer may be bonded to the substrate.

The substrate may have an electric circuit formed therein so that the circuit may be electrically connected to the image sensor chip formed thereon and an external device. For example, the substrate may be an organic substrate, a silicon substrate, bulk silicon, or a silicon-on-insulator (SOI) having an electrical circuit therein.

The image sensor chip may be disposed at the top of the image sensor package, and the molding layer, the external force absorbing layer and the adhesive layer may be disposed between the image sensor chip and the substrate.

A third surface of the molding layer may be coupled with the image sensor chip. A fourth surface opposed to the third surface of the molding layer may be coupled with the external force absorbing layer. The external force absorbing layer may be coupled with the fourth surface of the molding layer and may be bonded to the substrate through the adhesive layer.

Figure 11:
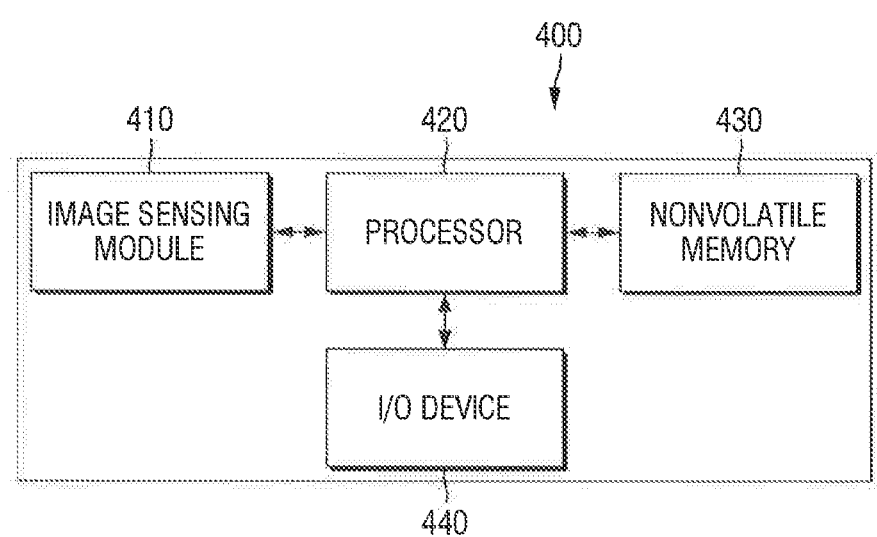
FIG. 11 is a block diagram illustrating a schematic configuration of an image sensing system that includes the image sensing module shown in FIGS. 6 and 7 according to an exemplary embodiment of the present inventive concept.

FIG. 11 is a block diagram showing a schematic configuration of an image sensing system that includes the image sensing module shown in FIGS. 6 and 7.

Referring to FIG. 11, the image sensing system 400 may include an image sensing module 410, a processor 420, a nonvolatile memory 430, and an input/output device 440. It is to be understood that the present inventive concept is not limited thereto. For example, additional elements may be included in the image sensing system 400 or some of the listed elements may be omitted.

The image sensing system 400 may be one of, for example, a TV, a DTV (digital TV), an IPTV (internet protocol TV), a PC (personal computer), a desktop computer, a laptop computer, a computer workstation, a tablet PC, a video game platform (or a video game console), a server, and a mobile computing device. The mobile computing device may be implemented as one of, for example, a mobile phone, a smart phone, an enterprise digital assistant (EDA), a digital still camera, a digital video camera, a portable multimedia player (PMP), a personal navigation device or a portable navigation device (PND), a mobile internet device (MID), a wearable computer, an internet of things (IOT) device, an internet of everything (IOE) device, and an e-book reader.

The image sensing module 410 may generate a digital image. An image signal captured by the image sensing module 410 may be converted into digital data through a signal processing circuit such as an analog-to-digital converter and then transmitted to the processor 420. The image sensing module 410 may have substantially the same configuration as that described above with reference to, for example, FIGS. 6 and 7. Therefore, to the extent that the description of various elements is omitted, it may be assumed that these elements are at least similar to corresponding elements that have already been described.

The processor 420 may perform various types of data processing on the image in the form of the digital data.

The non-volatile memory 430 may perform communications with the processor 420 to store the image in the form of the digital data. For example, the non-volatile memory 430 may include, but is not limited to, a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), etc.

The input/output device 440 may exchange image data with other electronic systems. For example, an image processed by the processor 420 may be output to an external device connected to the input/output device 440, for example, an external display, a printer and the like.

According to at least one of the above-described exemplary embodiments of the present inventive concept, an external force or impact applied to the back surface of the image sensor package may be reduced.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An image sensor package, comprising:
a substrate;
an image sensor chip disposed on the substrate;
an external force absorbing layer disposed between the substrate and the image sensor chip and having a first surface and a second surface opposite to the first surface;
an adhesive layer configured to bond the second surface of the external force absorbing layer to the substrate; and
a molding layer disposed on the first surface of the external force absorbing layer, wherein the molding layer is disposed between the image sensor chip and the external force absorbing layer,
wherein the adhesive layer has a first modulus, and the external force absorbing layer has a second modulus different from the first modulus.

2. The image sensor package of claim 1, wherein
the molding layer has a third surface and a fourth surface opposite to the third surface, wherein the third surface is disposed on the first surface of the external force absorbing layer,
wherein the image sensor chip is disposed on the fourth surface of the molding layer.

3. The image sensor package of claim 2, wherein the molding layer comprises a molding portion, a memory chip electrically connected to the image sensor chip, and a thermal die.

4. The image sensor package of claim 2, wherein an area of the first surface of the external force absorbing layer is substantially equal to an area of the third surface of the molding layer.

5. The image sensor package of claim 4, wherein an area of the second surface of the external force absorbing layer is substantially equal to an area of a fifth surface of the adhesive layer disposed on the second surface.

6. The image sensor package of claim 4, wherein an area of the second surface of the external force absorbing layer is different from an area of a fifth surface of the adhesive layer disposed on the second surface.

7. The image sensor package of claim 6, wherein an area of the second surface of the external force absorbing layer is greater than an area of the fifth surface of the adhesive layer.

8. The image sensor package of claim 2, wherein an area of the first surface of the external force absorbing layer is different from an area of the third surface of the molding layer.

9. The image sensor package of claim 8, wherein an area of the second surface of the external force absorbing layer is greater than an area of a fifth surface of the adhesive layer disposed on the second surface, and
wherein the area of the third surface of the molding layer is substantially equal to an area of the fifth surface of the adhesive layer.

10. The image sensor package of claim 8, wherein an area of the second surface of the external force absorbing layer is greater than an area of a fifth surface of the adhesive layer disposed on the second surface, and
wherein the area of the third surface of the molding layer is greater than the area of the fifth surface of the adhesive layer.

11. The image sensor package of claim 1, wherein the second modulus is less than the first modulus.

12. The image sensor package of claim 1, wherein the external force absorbing layer comprises a polyimide layer having the second modulus.

13. An image sensor package comprising:
a substrate;
an external force absorbing layer disposed on the substrate and having a first surface and a second surface opposite to the first surface, wherein the first surface faces the substrate;
an adhesive layer interposed between the external force absorbing layer and the substrate to bond the first surface of the external force absorbing layer to the substrate;
a molding portion disposed on the second surface of the external force absorbing layer and comprising a memory chip and a thermal die; and
an image sensor chip electrically connected to the memory chip and disposed on the molding portion,
wherein the adhesive layer has a first modulus, and the external force absorbing layer has a second modulus less than the first modulus.

14. The image sensor package of claim 13, wherein an area of the second surface of the external force absorbing layer is substantially equal to an area of a third surface of the molding portion, wherein the third surface of the molding portion is disposed on the second surface of the external force absorbing layer.

15. The image sensor package of claim 14, wherein an area of the first surface of the external force absorbing layer is substantially equal to an area of a fourth surface of the adhesive layer, wherein the first surface of the external force absorbing layer is disposed on the fourth surface of the adhesive layer.

16. The image sensor package of claim 14, wherein an area of a fourth surface of the adhesive layer disposed on the first surface of the external force absorbing layer is less than an area of the first surface of the external force absorbing layer.

17. The image sensor package of claim 13, wherein an area of the second surface of the external force absorbing layer is larger than an area of a third surface of the molding portion, wherein the third surface of the molding portion is disposed on the second surface of the external force absorbing layer.

18. The image sensor package of claim 17, wherein an area of the first surface of the external force absorbing layer is greater than an area of a fourth surface of the adhesive layer, wherein the first surface of the external force absorbing layer is disposed on the fourth surface of the adhesive layer, and
wherein the area of the third surface of the molding portion is substantially equal to an area of the fourth surface of the adhesive layer.

19. The image sensor package of claim 17, wherein an area of the first surface of the external force absorbing layer is greater than an area of a fourth surface of the adhesive layer, wherein the first surface of the external force absorbing layer is disposed on the fourth surface of the adhesive layer, and
wherein the area of the third surface of the molding portion is greater than the area of the fourth surface of the adhesive layer.

20. An image sensing module comprising:
a substrate having a first region, a second region surrounding the first region, and a third region surrounding the second region;
an adhesive layer having a first surface and a second surface opposed to each other, wherein the first surface is bonded to the first region of the substrate;
an external force absorbing layer bonded to the second surface of the adhesive layer;
a molding layer disposed on the external force absorbing layer and including a molding portion, a memory chip, and a thermal die;
an image sensor chip disposed on the molding layer and electrically connected to the memory chip;
a lens spaced apart from and disposed above the image sensor chip; and
a support member disposed in the third region of the substrate and supporting the lens, wherein the adhesive layer has a first modulus, and the external force absorbing layer has a second modulus less than the first modulus.

* * * * *